US009781867B2

(12) United States Patent
Yonak et al.

(10) Patent No.: US 9,781,867 B2
(45) Date of Patent: Oct. 3, 2017

(54) POWER MODULE ASSEMBLY FOR A VEHICLE POWER INVERTER

(71) Applicant: Ford Global Technologies, LLC, Dearborn, MI (US)

(72) Inventors: Serdar Hakki Yonak, Ann Arbor, MI (US); Vincent Skalski, Plymouth, MI (US); Shailesh Shrikant Kozarekar, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 34 days.

(21) Appl. No.: 15/047,764

(22) Filed: Feb. 19, 2016

(65) Prior Publication Data
US 2017/0245401 A1 Aug. 24, 2017

(51) Int. Cl.
| | |
|---|---|
| H05K 7/20 | (2006.01) |
| B60K 6/26 | (2007.10) |
| H05K 7/14 | (2006.01) |
| B60K 6/365 | (2007.10) |
| B60K 6/543 | (2007.10) |
| B60K 6/383 | (2007.10) |
| B60K 6/445 | (2007.10) |
| H02M 7/00 | (2006.01) |
| H02P 27/06 | (2006.01) |

(52) U.S. Cl.
CPC ......... H05K 7/20927 (2013.01); B60K 6/26 (2013.01); B60K 6/365 (2013.01); B60K 6/383 (2013.01); B60K 6/445 (2013.01); B60K 6/543 (2013.01); H02M 7/003 (2013.01); H05K 7/1418 (2013.01); *B60Y 2200/92* (2013.01); *B60Y 2400/61* (2013.01); *H02P 27/06* (2013.01); *Y10S 903/906* (2013.01); *Y10S 903/91* (2013.01); *Y10S 903/913* (2013.01); *Y10S 903/918* (2013.01); *Y10S 903/93* (2013.01)

(58) Field of Classification Search
CPC .... H05K 7/20927; H05K 7/1418; B60K 6/26; B60K 6/365; B60K 6/543; B60K 6/383; B60K 6/445; H02M 7/003; H02P 27/06; B60Y 2400/61; B60Y 2200/92; Y10S 903/9906; Y10S 903/91; Y10S 903/913; Y10S 903/918; Y10S 903/93
USPC .................................................. 361/699–703
See application file for complete search history.

(56) References Cited

U.S. PATENT DOCUMENTS

| | | | |
|---|---|---|---|
| 7,230,832 B2 | 6/2007 | Brandenburg et al. | |
| 2008/0251909 A1* | 10/2008 | Tokuyama | H01L 23/473 257/706 |
| 2010/0279152 A1* | 11/2010 | Payne | F28F 27/00 429/50 |
| 2013/0176761 A1 | 7/2013 | Hattori et al. | |
| 2014/0098588 A1* | 4/2014 | Kaneko | H02M 7/003 363/141 |

(Continued)

Primary Examiner — Anthony Haughton
Assistant Examiner — Yahya Ahmad
(74) Attorney, Agent, or Firm — David Kelley; Brook Kushman, P.C.

(57) ABSTRACT

A power module assembly includes opposing end caps collectively having coolant ports and a row of cards that each have a major side defining a projection extending across the card. A side panel extends between the end caps such that the panel and row define a channel in fluid communication with the ports and configured to convey coolant directly across the cards. The side panel defines a groove that receives the projections.

20 Claims, 8 Drawing Sheets

(56) References Cited

U.S. PATENT DOCUMENTS

2014/0160823 A1* 6/2014 Uetake .................. H02M 7/003
                                                          363/141
2014/0313671 A1* 10/2014 Sugita ................ H05K 7/20927
                                                          361/700
2015/0016063 A1   1/2015 Higuma et al.
2016/0309622 A1* 10/2016 Lei ..................... H05K 7/20927

* cited by examiner

POWER MODULE ASSEMBLY FOR A VEHICLE POWER INVERTER

TECHNICAL FIELD

The present disclosure relates to power module assemblies for power inverters of motor vehicles.

BACKGROUND

Vehicles such as battery-electric vehicles (BEVs), plug-in-hybrid-electric vehicles (PHEVs) and fully hybrid-electric vehicles (FHEVs) contain a traction battery assembly to act as an energy source for one or more electric machines. The traction battery includes components and systems to assist in managing vehicle performance and operations. A power inverter is electrically connected between the battery and the electric machines to convert the direct current coming from the battery into alternating current compatible with the electric machines. The power inverter may also act as a rectifier to convert alternating current from the electric machines to direct current compatible with the battery.

SUMMARY

According to one embodiment, a power module assembly includes opposing end caps collectively having coolant ports, and a row of cards that each have a major side defining a projection extending across the card. A side panel extends between the end caps such that the panel and row define a channel in fluid communication with the ports and configured to convey coolant directly across the cards. The side panel defines a groove that receives the projections According to another embodiment, a power module assembly includes a card module having spaced apart side panels defining a coolant chamber and cards disposed therein. The assembly further includes opposing end caps each having walls defining a cavity that receives one end of the card module such that an inner surface of the walls engages with an outer surface of the panels. One of the end caps defines a port in fluid communication with the chamber to convey coolant across the cards.

According to yet another embodiment, a power module assembly for a power inverter of a vehicle includes a housing having a panel extending between opposing end caps. The panel has an inner side defining a first connection feature extending along a longitudinal direction of the panel. The housing further has a cavity at least partial defined by the inner side and the end caps. An array of cards is disposed within the cavity and each have opposing major sides and minor sides extending therebetween. At least one of the cards defines a second connection feature extending across one of the major sides of the card and engaging with the first connection feature to connect the card and the panel. A coolant passage, that is in fluid communication with the port, is defined between the at least one card and the panel and is configured to convey coolant directly across the at least one card.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
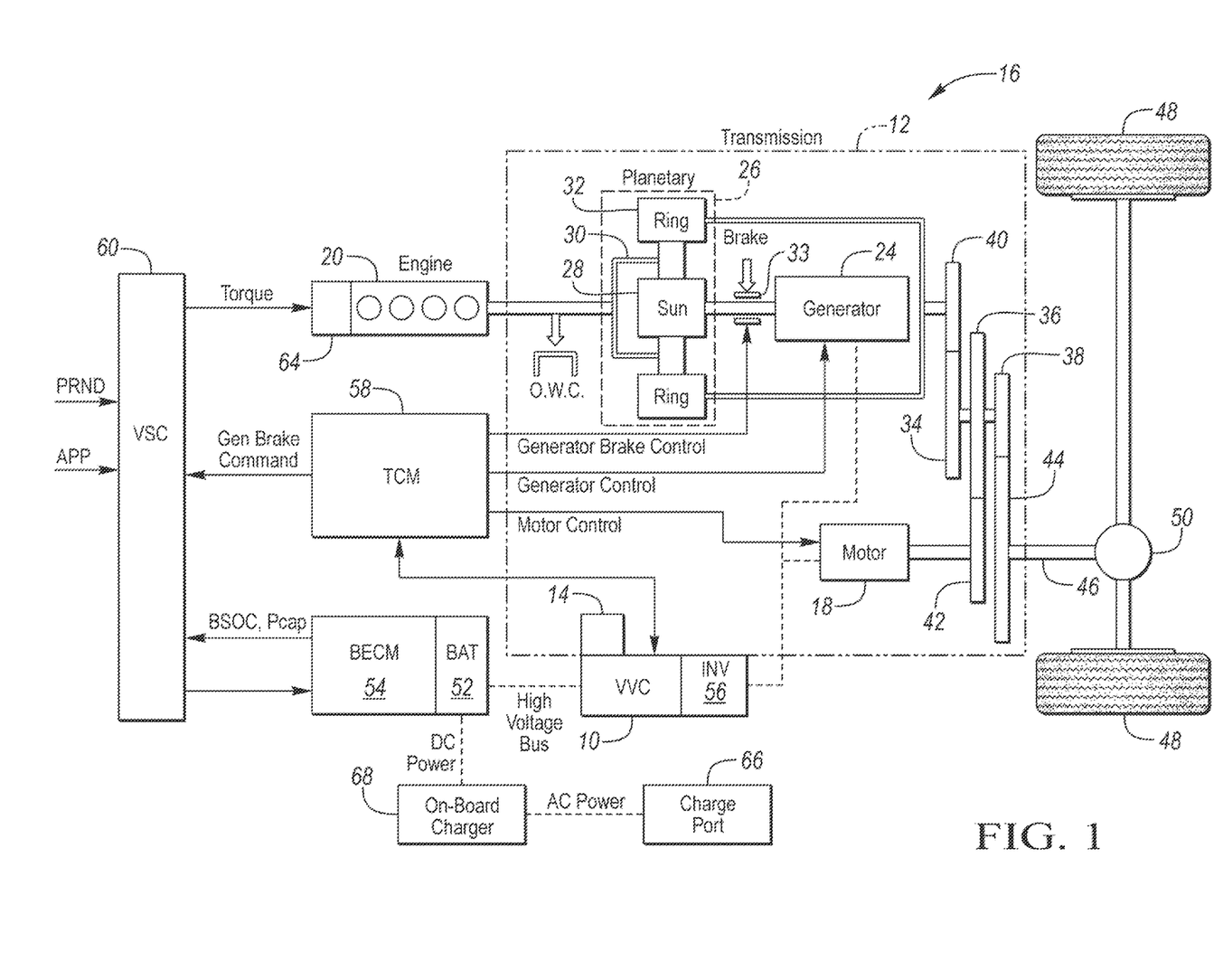
FIG. 1 is a schematic diagram of an example hybrid vehicle.

An example of a PHEV is depicted in FIG. 1 and referred to generally as a vehicle 16. The vehicle 16 includes a transmission 12 and is propelled by at least one electric machine 18 with selective assistance from an internal combustion engine 20. The electric machine 18 may be an alternating current (AC) electric motor depicted as "motor" 18 in FIG. 1. The electric machine 18 receives electrical power and provides torque for vehicle propulsion. The electric machine 18 also functions as a generator for converting mechanical power into electrical power through regenerative braking.

The transmission 12 may be a power-split configuration. The transmission 12 includes the first electric machine 18 and a second electric machine 24. The second electric machine 24 may be an AC electric motor depicted as "generator" 24 in FIG. 1. Like the first electric machine 18, the second electric machine 24 receives electrical power and provides output torque. The second electric machine 24 also functions as a generator for converting mechanical power into electrical power and optimizing power flow through the transmission 12. In other embodiments, the transmission does not have a power-split configuration.

The transmission 12 may include a planetary gear unit 26, which includes a sun gear 28, a planet carrier 30, and a ring gear 32. The sun gear 28 is connected to an output shaft of the second electric machine 24 for receiving generator torque. The planet carrier 30 is connected to an output shaft of the engine 20 for receiving engine torque. The planetary gear unit 26 combines the generator torque and the engine torque and provides a combined output torque about the ring gear 32. The planetary gear unit 26 functions as a continuously variable transmission, without any fixed or "step" ratios.

The transmission 12 may also include a one-way clutch (O.W.C.) and a generator brake 33. The O.W.C. is coupled to the output shaft of the engine 20 to only allow the output shaft to rotate in one direction. The O.W.C. prevents the transmission 12 from back-driving the engine 20. The generator brake 33 is coupled to the output shaft of the second electric machine 24. The generator brake 33 may be activated to "brake" or prevent rotation of the output shaft of the second electric machine 24 and of the sun gear 28. Alternatively, the O.W.C. and the generator brake 33 may be eliminated and replaced by control strategies for the engine 20 and the second electric machine 24.

The transmission 12 may further include a countershaft having intermediate gears including a first gear 34, a second gear 36 and a third gear 38. A planetary output gear 40 is connected to the ring gear 32. The planetary output gear 40 meshes with the first gear 34 for transferring torque between the planetary gear unit 26 and the countershaft. An output gear 42 is connected to an output shaft of the first electric machine 18. The output gear 42 meshes with the second gear 36 for transferring torque between the first electric machine 18 and the countershaft. A transmission output gear 44 is connected to a driveshaft 46. The driveshaft 46 is coupled to a pair of driven wheels 48 through a differential 50. The transmission output gear 44 meshes with the third gear 38 for transferring torque between the transmission 12 and the driven wheels 48.

The vehicle 16 includes an energy storage device, such as a traction battery 52 for storing electrical energy. The battery 52 is a high-voltage battery that is capable of outputting electrical power to operate the first electric machine 18 and the second electric machine 24. The battery 52 also receives electrical power from the first electric machine 18 and the second electric machine 24 when they are operating as generators. The battery 52 is a battery pack made up of several battery modules (not shown), where each battery module contains a plurality of battery cells (not shown). Other embodiments of the vehicle 16 contemplate different types of energy storage devices, such as capacitors and fuel cells (not shown) that supplement or replace the battery 52. A high-voltage bus electrically connects the battery 52 to the first electric machine 18 and to the second electric machine 24.

The vehicle includes a battery energy control module (BECM) 54 for controlling the battery 52. The BECM 54 receives input that is indicative of vehicle conditions and battery conditions, such as battery temperature, voltage and current. The BECM 54 calculates and estimates battery parameters, such as battery state of charge and the battery power capability. The BECM 54 provides output (BSOC, $P_{cap}$) that is indicative of a battery state of charge (BSOC) and a battery power capability ($P_{cap}$) to other vehicle systems and controllers.

The vehicle 16 includes a DC-DC converter or variable voltage converter (VVC) 10 and an inverter 56. The VVC 10 and the inverter 56 are electrically connected between the traction battery 52 and the first electric machine 18, and between the battery 52 and the second electric machine 24. The VVC 10 "boosts" or increases the voltage potential of the electrical power provided by the battery 52. The VVC 10 also "bucks" or decreases the voltage potential of the electrical power provided to the battery 52, according to one or more embodiments. The inverter 56 inverts the DC power supplied by the battery 52 (through the VVC 10) to AC power for operating the electric machines 18, 24. The inverter 56 also rectifies AC power provided by the electric machines 18, 24, to DC for charging the traction battery 52. Other embodiments of the transmission 12 include multiple inverters (not shown), such as one invertor associated with each electric machine 18, 24. The VVC 10 includes an inductor assembly 14.

The transmission 12 includes a transmission control module (TCM) 58 for controlling the electric machines 18, 24, the VVC 10 and the inverter 56. The TCM 58 is configured to monitor, among other things, the position, speed, and power consumption of the electric machines 18, 24. The TCM 58 also monitors electrical parameters (e.g., voltage and current) at various locations within the VVC 10 and the inverter 56. The TCM 58 provides output signals corresponding to this information to other vehicle systems.

The vehicle 16 includes a vehicle system controller (VSC) 60 that communicates with other vehicle systems and controllers for coordinating their function. Although it is shown as a single controller, the VSC 60 may include multiple controllers that may be used to control multiple vehicle systems according to an overall vehicle control logic, or software.

The vehicle controllers, including the VSC 60 and the TCM 58 generally includes any number of microprocessors, ASICs, ICs, memory (e.g., FLASH, ROM, RAM, EPROM and/or EEPROM) and software code to co-act with one another to perform a series of operations. The controllers also include predetermined data, or "look up tables" that are based on calculations and test data and stored within the memory. The VSC 60 communicates with other vehicle systems and controllers (e.g., the BECM 54 and the TCM 58) over one or more wired or wireless vehicle connections using common bus protocols (e.g., CAN and LIN). The VSC 60 receives input (PRND) that represents a current position of the transmission 12 (e.g., park, reverse, neutral or drive). The VSC 60 also receives input (APP) that represents an accelerator pedal position. The VSC 60 provides output that represents a desired wheel torque, desired engine speed, and generator brake command to the TCM 58; and contactor control to the BECM 54.

The vehicle 16 includes an engine control module (ECM) 64 for controlling the engine 20. The VSC 60 provides output (desired engine torque) to the ECM 64 that is based on a number of input signals including APP, and corresponds to a driver's request for vehicle propulsion.

If the vehicle 16 is a PHEV, the battery 52 may periodically receive AC energy from an external power supply or grid, via a charge port 66. The vehicle 16 also includes an on-board charger 68, which receives the AC energy from the charge port 66. The charger 68 is an AC/DC converter which converts the received AC energy into DC energy suitable for charging the battery 52. In turn, the charger 68 supplies the DC energy to the battery 52 during recharging. Although illustrated and described in the context of a PHEV 16, it is understood that the inverter 56 may be implemented on other types of electric vehicles, such as a HEV or a BEV.

Figure 2:
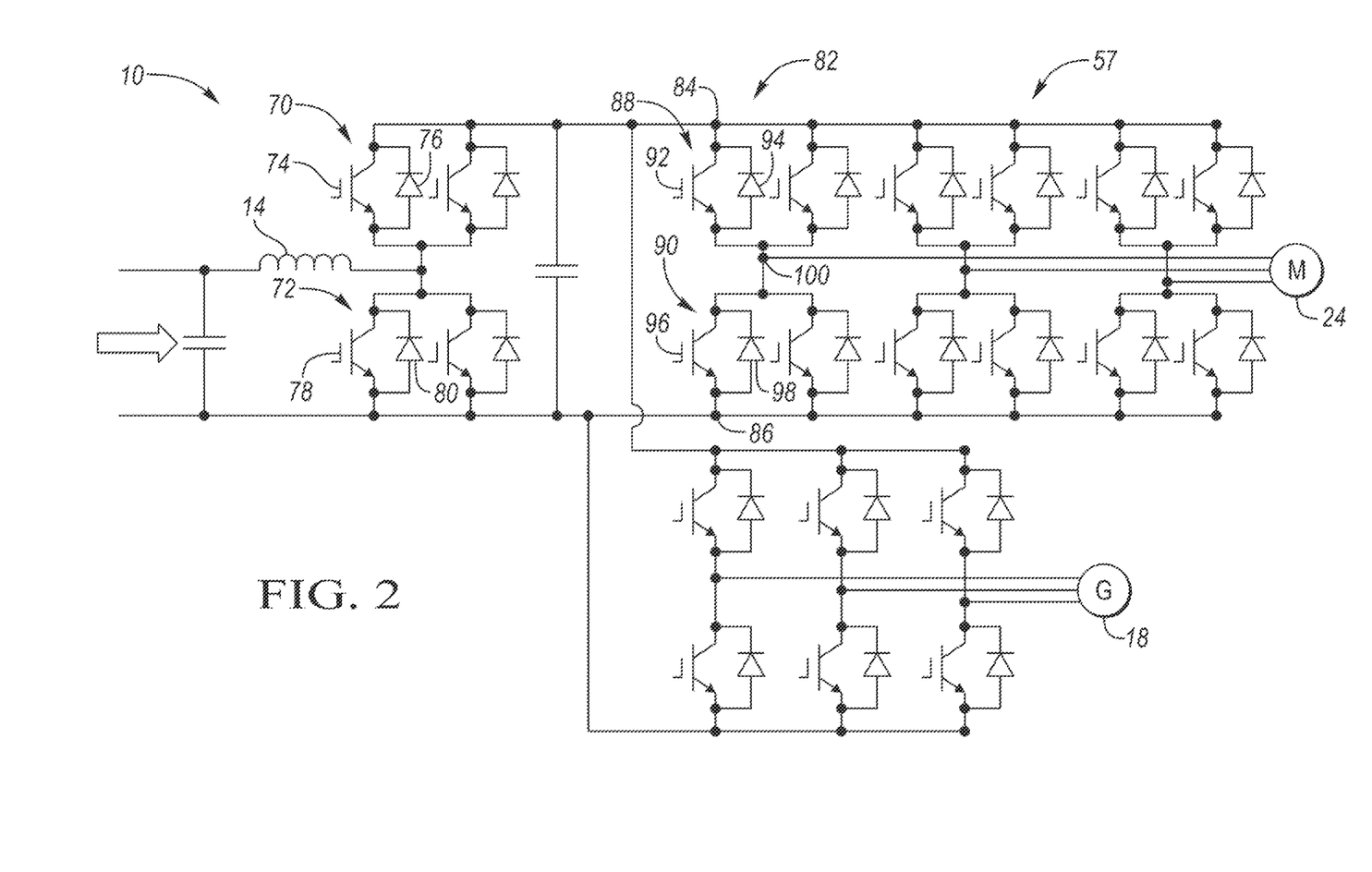
FIG. 2 is a schematic diagram of a variable voltage converter and a power inverter.

Referring to FIG. 2, an electrical schematic of the VVC 10 and the power module assembly 57 of the power inverter 56 is shown. The VVC 10 may include a one or more cards having at least a first switching unit 70 and a second switching unit 72 for boosting the input voltage ($V_{bat}$) to provide output voltage ($V_{dc}$). The first switching unit 70 may include a first transistor 74 connected in parallel to a first diode 76, but with their polarities switched (anti-parallel). In one embodiment the switch 70 may be a reverse conducting insulated gate bipolar transistor (RCIGBT). The second switching unit 72 may include a second transistor 78 connected anti-parallel to a second diode 80. Each transistor 74, 78 may be any type of controllable switch (e.g., an insulated gate bipolar transistor (IGBT) or field-effect transistor (FET)). Additionally, each transistor 74, 78 may be individually controlled by the TCM 58. The inductor assembly 14 is depicted as an input inductor that is connected in series between the traction battery 52 and the switching units 70, 72. The inductor 14 generates magnetic flux when a current is supplied. When the current flowing through the inductor 14 changes, a time-varying magnetic field is created, and a voltage is induced. Other embodiments of the VVC 10 include alternative circuit configurations.

The power module assembly 57 may include a plurality of cards (also known as power modules) that are stacked in an assembly. Each of the cards may include one or more half bridges 82 having a positive DC lead 84 that is coupled to a positive DC node from the battery and a negative DC lead 86 that is coupled to a negative DC node from the battery. Each of the half bridges 82 may also include a first switching unit 88 and a second switching unit 90. The first switching unit 88 may include a first transistor 92 connected in parallel to a first diode 94. The second switching unit 90 may include a second transistor 96 connected in parallel to a second diode 98. The first and second transistors 88, 96 may be IGBTs or FETs. The first and second switching units 88, 90 may be similar to the switching units 70, 72. The first and second switching units of the each of the half-bridges 82 convert the DC power of the battery into a single phase AC output at the AC lead 100. Each of the AC leads 100 are electrically connected to the motor 18 or generator 24.

Figure 3:
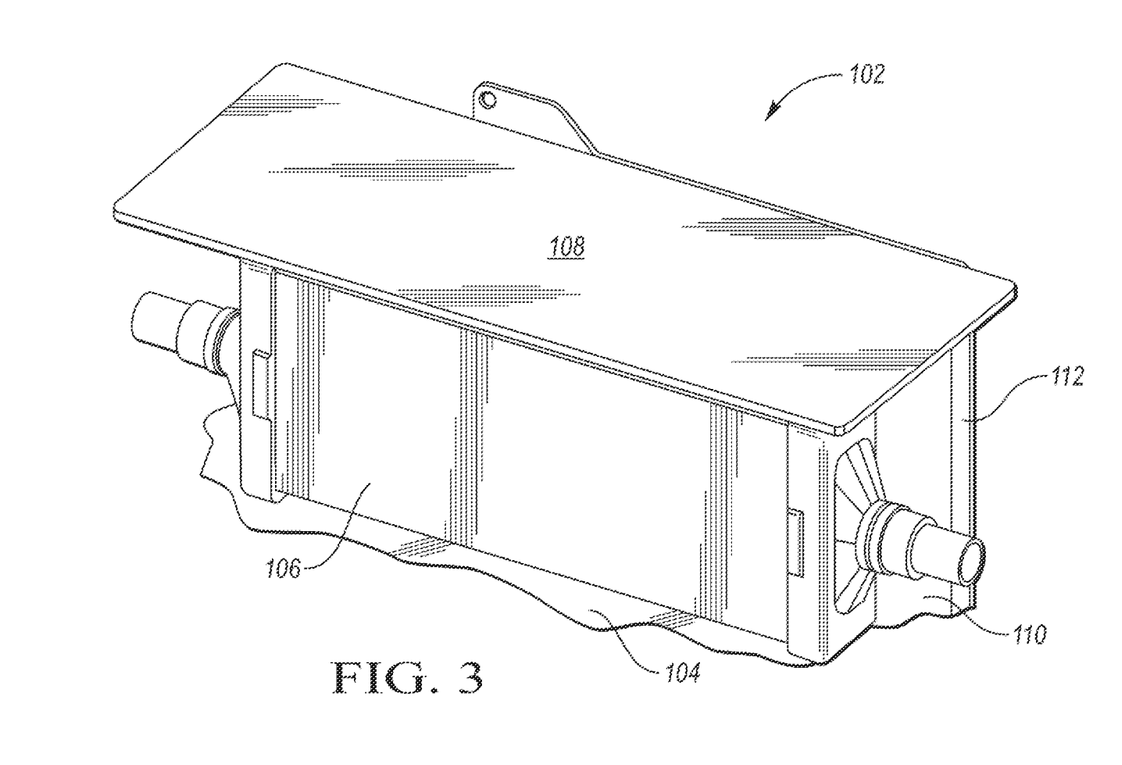
FIG. 3 is a schematic diagram of a vehicle power inverter.
Figure 4:
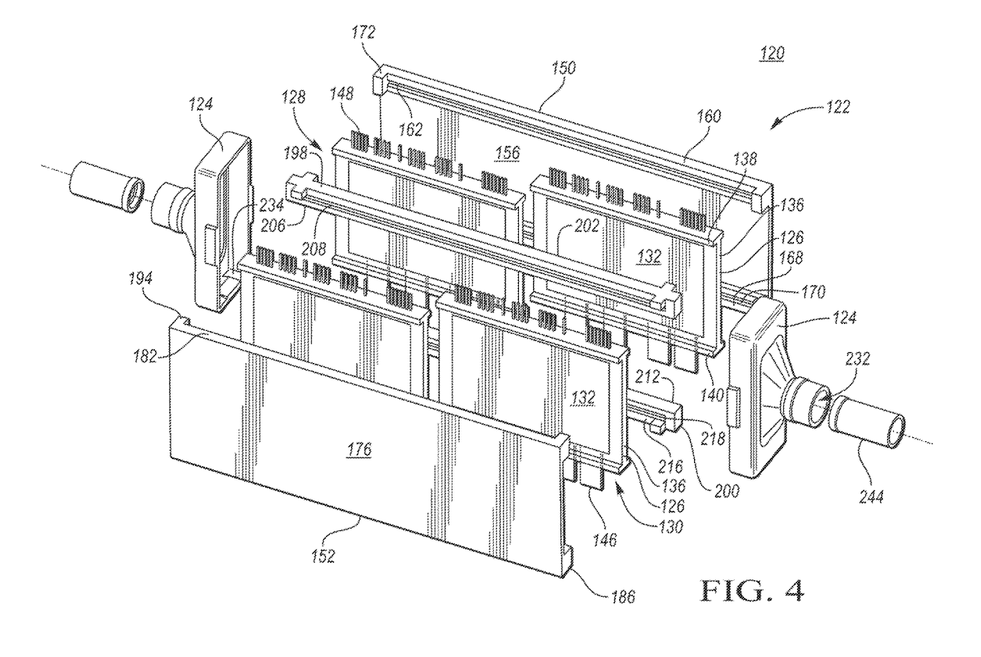
FIG. 4 is an exploded view of a power module assembly.
Figure 5:
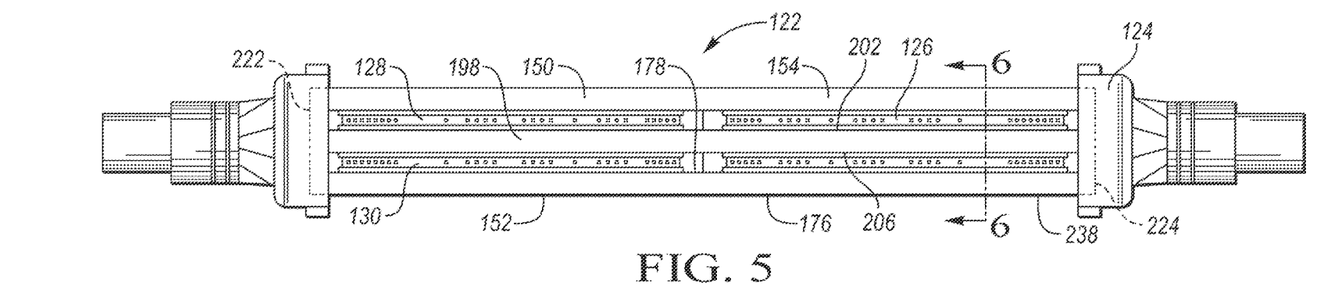
FIG. 5 is a top view of the power module assembly of FIG. 4.
Figure 6:
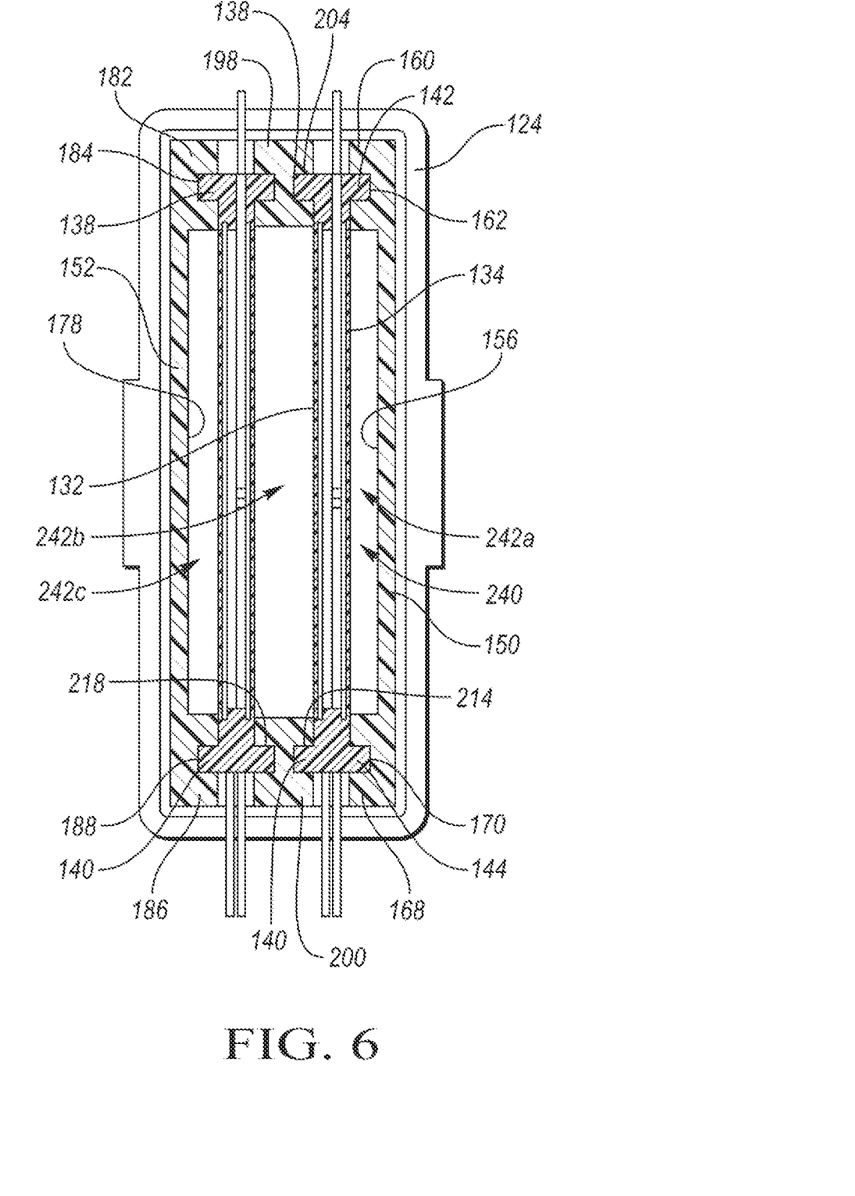
FIG. 6 is a section view along cutline 6-6.
Figure 7:
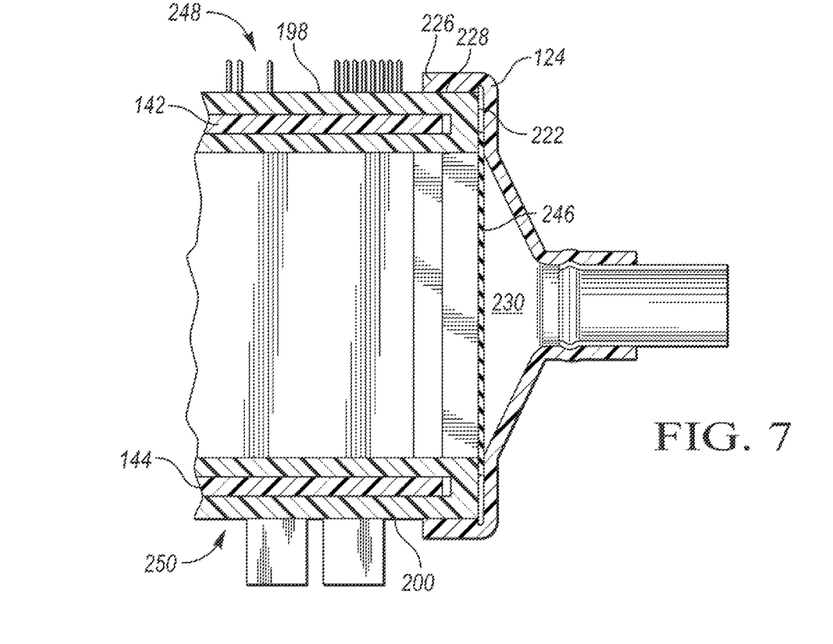
FIG. 7 is a side view, in cross section, of an end portion of the power module assembly of FIG. 4.

Referring to FIG. 3, a vehicle power inverter 102 may be mounted on a vehicle component 104, such as a body structure, frame member, or powertrain component. The power inverter 102 may include a power module assembly 106 that is electrically connected with a gate drive board 108, a capacitor bank 110, and a control board 112. The power-module assembly 106 may include a plurality of cards (also known as power modules) each having one or more half bridges packaged therein.

FIGS. 4 to 10 and the related discussion describe example power module assemblies. Referring to FIGS. 4 through 7, an example power module assembly 120 includes a card module 122 that is sandwiched by a pair of opposing end caps 124. The card module 122 includes a plurality of cards 126 that each includes a first major side 132, a second major side 134, and minor sides 136 extending therebetween. The first major side 132 includes an upper connection feature 138, and a lower connection feature 140. The second major side 134 includes an upper connection feature 142, and a lower connection feature 144. Each of the illustrated connection features is a projection extending along a corresponding major side between the minor sides. In other embodiments, the connection feature may be groove or any other feature enabling the card to be assembled to another component of the module 122. Each of the cards 126 also includes terminals 146 and signal pins 148 extending from the minor sides 136.

The cards 126 may be arranged in an array having a first row 128 and a second row 130. The rows may be substantially parallel to each other. As used herein the term "substantially" should be construed or understood to mean—not crossing along their-length-or-at an angle of less than or equal to three degrees relative to each other. The cards 126 of each row may be arranged end-to-end with minor sides 136 touching. The rows are positioned relative to each other such that major sides of the cards in the first row 128 face major sides of the cards in the second row 130. It is to be understood that the illustrated two-by-two arrangement of cards is not limiting and that the cards may be arranged in many different configurations. For example, the card module 122 may only include a single row of cards, or may include three or more rows of cards. Each of the rows may also include more or less than two cards.

The card module 122 also includes first and second side panels 150, 152 that extend between the end caps 124. The side panels may be substantially parallel. The first side panel 150 includes an outer side 154, and an inner side 156. The first row 128 of cards 126 may be arranged substantially parallel relative to the first side panel 150 with the second major side 132 of the cards 126 facing the inner side 156 of the panel 150. An upper ledge 160 and a lower ledge 168 each projects inwardly from the inner surface 158 towards the first row 128 of cards 126. The upper ledge 160 includes a connection feature 162 that cooperates with the upper connection feature 142, and the lower ledge 168 includes a connection feature 170 that cooperates with the lower connection feature 144. In the illustrated embodiment, the connection features 162, 170 are grooves that extend along respective ledges. The groove 162 receives the upper projections 142 of the cards in the first row 128, and the groove 170 receives the lower projections 144 of the cards in the first row 128.

The second side panel 152 includes an outer side 176, and an inner side 178. The second row 130 of cards 126 may be arranged substantially parallel relative to the second side panel 152 with the major side 132 of the cards 126 facing the inner side 178 of the panel 152. The side panels 150, 152 may be contoured to place the inner surface closer to a corresponding row of cards. An upper ledge 182 and a lower ledge 186 each projects inwardly from the inner side 178 towards the second row 130 of cards 126. The upper ledge 182 includes a connection feature 184 that cooperates with the upper connection feature 138, and the lower ledge 186 includes a connection feature 188 that cooperates with the lower connection feature 140. In the illustrated embodiment, the connection features 184, 188 are grooves that extend along respective ledges. The groove 184 receives the upper projections 138 of the cards in the second row 130, and the groove 188 receives the lower projections 140 of the cards in the second row 130.

The card module 122 may also include an upper center spacer 198 and a lower center spacer 200 that each extend between the end caps 124. The spacers 198, 200 may be substantially parallel to the side panels 150, 152. The upper spacer 198 includes a first longitudinal side 202 that faces the first row of cards 128, and a second longitudinal side 206 that faces the second row of cards 130. The first longitudinal side 202 includes a connection feature 204 that engages with the upper connection features 138. For example, the first longitudinal side 202 defines a groove 204 that receives the projections 138 of the cards in the first row 128. The second longitudinal side 206 includes a connection feature 208 that engages with the upper connection features 142. For example, the second longitudinal side defines a groove 208 that receives the projections 142 of the cards in the second row 130.

The lower center spacer 200 may include a first longitudinal side 212 that faces the first row of cards 128, and a second longitudinal side 216 that faces the second row of cards 130. The first longitudinal side 212 includes a connection feature 214 that engages with the lower connection features 140. For example, the first longitudinal side 212 defines a groove 214 that receives the projections 140 of the cards in the first row 128. The second longitudinal side 216 includes a connection feature 218 that engages with the lower connection features 144. For example, the second longitudinal side defines a groove 218 that receives the projections 144 of the cards in the second row 130.

The power module 120 may be formed by first assembling the card module 122 and then inserting a first end 222 of the card module into one of the end caps 124, and inserting a second end 224 of the card module into the other of the end caps 124. Each of the end caps 124 includes walls 226 having inner surfaces 228 that define a cavity 230. The ends of the card module 122 may be received into the cavity 230 such that the outer sides 154, 176 of the side panels 150, 152 engage with the inner surfaces 228 of the walls 226. Each of the end caps 124 also includes recesses 234 that each receive one of the tabs 172 of the first side panel 150 or one of the tabs 194 of the second side panel 152.

The first and second side panels 150, 152 and the end caps 124 cooperate to define a housing 238 of the power module assembly 120. The housing 238 defines a coolant chamber 240 having a plurality of coolant passages 242 that convey coolant directly across the major sides of the cards 126. Each of the end caps 124 may define one or more coolant ports 232 for circulating coolant into, or out of, the coolant chamber 240. For example, one of the end caps may define an inlet port and the other of end caps may define an outlet port. In some embodiments, the inlet and outlet ports are defined in a same end cap. The coolant ports 232 may be connected to a coolant line 244 that is connected to a thermal management system of the vehicle.

In the illustrated embodiment, a first passage 242a is defined between the inner side 156 of the first panel 150 and the first row of cards 128. The second major side 134 of the cards 126 in the first row 128 are in direct contact with coolant passing through the first passage 242a. A second passage 242b is defined between the first row of cards 128 and the second row of cards 130. The center spacers 198, 200 ensure that a gap is maintained between the first and second rows. The major side 132 of the cards 126 in the first row 128 and major side 134 of the cards 126 in the second row 130 are in direct contact with coolant passing through the second passage 242b. A third passage 242c is defined between the inner side 178 of the second panel 150 and the second row of cards 130. The major side 132 of the cards 126 in the second row 130 are in direct contact with coolant passing through the third passage 242c.

Having the liquid coolant in direct contact with the cards 126 reduces the thermal resistance of the cooling system compared to cold plate and cooling fin designs by eliminating the thermal resistance of the cold-plate top or the fins. This creates a more efficient heat transfer between the cards and the coolant compared to traditional designs.

The housing 238 needs to be watertight to prevent coolant from leaking from the power module assembly 120. The connection features of the various components may cooperate to forming sealing surfaces. For example, the projections 142 and the grooves 162 form an upper sealing surface for the first coolant passage 242a. The connection between the grooves and projections may be sealed by a gasket disposed in the groove or may be sealed by adhesive, or solvent-based bonding to create a plastic weld. Other mating surfaces may be similarly sealed. A gasket or sealant may also be applied on mating minor sides of adjacent cards 126. In the illustrated embodiment, a seal is created between the ends of the card module 122 and a respective end cap 124 via an O-ring 246. Alternatively, sealant or solvent-based bonding may be applied between the side panels 150, 152 and the walls 226. A potting material may also be disposed along the top 248 and the bottom 250 of the rows to further seal the cards to the side panels, spacers, and end caps.

Figures 8, 9, 10:
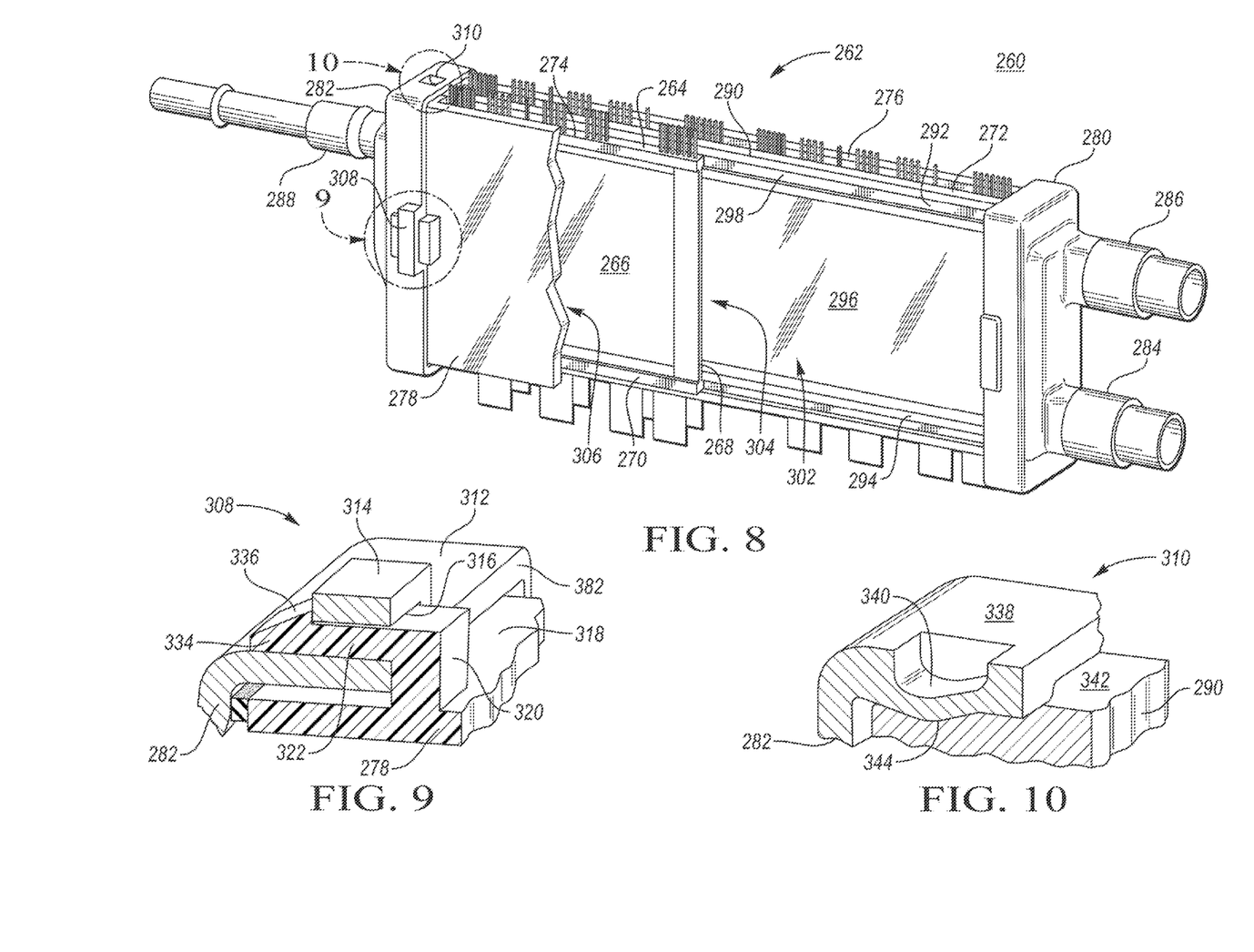
FIG. 8 is a perspective view of another power module assembly.
FIG. 9 is an enlarged perspective view, in cross section, of a connection feature.
FIG. 10 is an enlarged perspective view, in cross section, of another connection feature.

Referring to FIG. 8, another power module assembly 260 includes a card module 262 having a plurality of cards 264. The cards 264 may have major sides 266 and minor sides 268. A connection feature 270 (e.g., a projection) may be provided on the major sides 266 as described above with reference to the other embodiments. The cards 264 may be arranged in first and second rows 272, 274 with each row having two cards. (Note: the fourth card is not shown for illustration purposes.) It is to be understood, however, that the cards may be arranged in more or less than two rows, and that each row may include more or less than two cards. A first side panel 276 is disposed adjacent to the first row of cards 272, and a second side panel 278 is disposed adjacent to the second row of cards 274. A center spacer 290 is disposed between the first and second rows of cards 272, 274. The center spacer 290 includes an upper portion 292, a lower portion 294, and a web 296 extending between the upper and lower portions. The center spacer 290 may include one or more connection features 298 (e.g., a groove) that cooperate with the connection features 270. The first and second panels 276, 278 may also include connection features that cooperate with connection features of the cards as described above with the other embodiments.

The card module 262 is sandwiched by a first end cap 280 and a second end cap 282 as described above. The first end cap 280 may include an inlet port 284 and an outlet port 286 and the second end 282 may include an expansion port 288. The ports may be arranged differently in other embodiments. Unlike power module 120 (which circulates coolant straight through the module), power module 260 has a U-shaped coolant circuit where coolant is circulated into and out of the same end cap. For example, the card module 262 includes a first coolant chamber (not visible) defined between the first side panel 276 and the center spacer 290, and a second coolant chamber 302 defined between the center spacer 290 and the second side panel 278. The first row of cards 272 is disposed within the first coolant chamber and is in direct contact with the coolant in the first chamber, and the second row of cards 274 is disposed within the second coolant chamber 302 and is in direct contact with the coolant in the second chamber. The second coolant chamber 302 may include a first passage 304 defined between the spacer 290 and the second row of cards 274, and a second passage 306 defined between the second row of cards 274 and the second side panel 278. The first coolant chamber may similarly include multiple passageways. In operation, coolant may be circulated from the inlet port 284, through the first coolant chamber, and to the second and end cap 282. The second end cap 282 may include features to reroute the coolant into the second cooling chamber 304, back to the first end cap 280, and out the outlet port 286. The inlet and outlet ports 284, 286 may be offset (e.g., left or right) of the center spacer 290 to place the ports in fluid communication with a respective coolant chamber. The power module 260 may include sealing means as described above with the other embodiments.

The card module 262 and the end caps 280, 282 may include connection features 308, 310 for connecting the module 262 to the end caps. These features 308, 310 may be utilized alone or in cooperation with other means (e.g. adhesive, solvent-based bonding, or technique known in the art) to secure the ends caps and the card module.

Referring to FIG. 9, a magnified view of the connection feature 308 is shown. The side panel 278 includes an outer surface 318 having a clip 320 disposed thereon. The end cap 282 includes a sidewall 312 having a U-shaped component 314 that defines a slot 316. The clips 320 is inserted into the slot 316 in order to snap the end cap 282 to the card module 262. The clips 320 includes a shaft 322 that is received within the slot 316 when the parts are connected, and a head 334 that is disposed on a backside of the component 314 when the clip 320 is installed through the slot 316. The head 334 includes a barb 336 that cooperates with a wall of the component 314 to resist the clip 320 from pulling out of the slot 316.

Referring to FIG. 10, a magnified view of the connection feature 310 is shown. The end cap 282 includes a top 338 having a detent 340. The detent 340 cooperates with a dimple 344 defined in a top 342 of the center spacer 290 to secure the end cap 282 to the card module 262. It is to be understood that the power module 260 may include only one type of the connection features 308, 310, both types of the connection features, or none of the connection features depending upon the design parameters.

Figure 11:
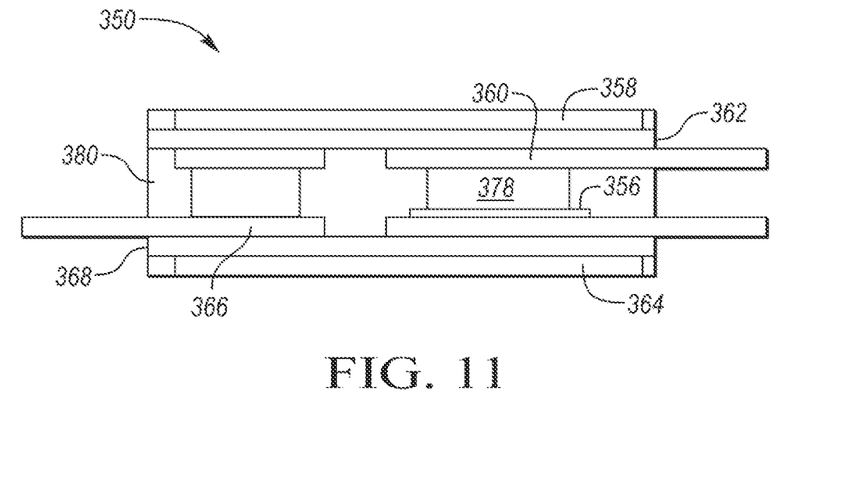
FIG. 11 is a top view of an example card.
Figure 12:
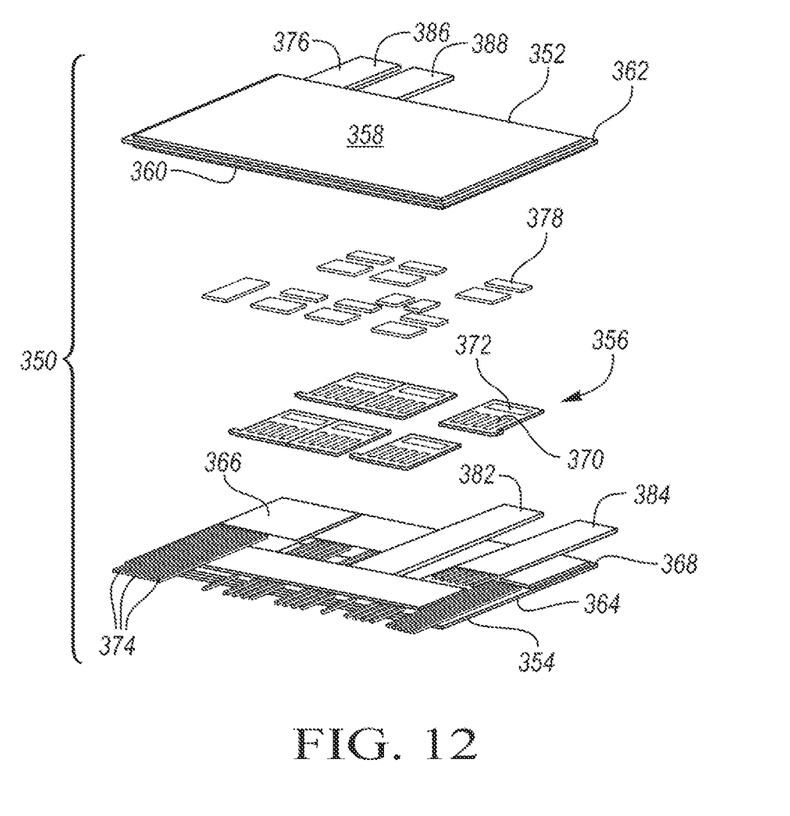
FIG. 12 is an exploded view of the card shown in FIG. 11.

FIGS. 11 and 12 and the associated text describe an example card (or power module) 350 for a power module assembly (such as power module assembly 120 or power module assembly 260). The card 350 may include a first substrate 352 and a second substrate 354 that sandwich a plurality of switching units 356. The first substrate 352 includes an outer panel 358, an inner panel 360, and a dielectric layer 362 disposed between the inner and outer panels. The outer panel 358 defines an outer major side of the card, the inner panel 360 defines an inner major side of the substrate, and the thin edges of the panels and dielectric layer collectively define a portion of the minor sides of the card. The panels and dielectric layer are bonded together by a high-temperature oxidation process for example. The inner and outer panels 358, 360 may be metal such as copper, aluminum, silver, or gold. In one embodiment, the outer panel 358 is unpatterned copper and the inner panel 368 is patterned copper. The term "patterned" refers to a panel that has been etched to define an electrical circuit. The dielectric layer 362 may be ceramic. Example ceramics include alumina, aluminum nitride, and silicon nitride. In some embodiments, the ceramics may be doped. The second substrate 354 also includes an outer panel 364, in inner panel 366, and a dielectric layer 362. The materials of the inner and outer panels and the dielectric layer maybe similar to that described above with respect to the first substrate 352.

The card 350 includes one or more switching units 356 (also known as chips or dies), such as six switching units shown in the illustrated embodiment of FIG. 12. Each of the switching units 356 includes a transistor 370 and a diode 372. The transistor 370 may be, but is not limited to, IGBTs or FETs. Each of the switching units 356 is electrically connected to one or both of the inner panel 360 and/or the inner panel 366. The card 350 includes a plurality of shims 378 that electrically connect the switching units 356 to one of the inner panels and act as spacing features. A mold compound 380 encapsulates the internal components of the card 350.

The card 350 also includes a plurality of terminals 376 and signal pins 374. For example, the card 350 may include a positive DC terminal 382, a negative DC terminal 384, a generator AC terminal 386, and a motor AC terminal 388. The DC terminals 382, 384 are electrically connected with the capacitor bank and the traction battery. The AC terminals 386, 388 are electrically connected to an associated electric machine. The signal pins 374 are electrically connected to the gate drive board. The terminals and pins may be formed by a patterned inner panel or may be separate components attached to the switching units 356.

While example embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A power module assembly for a power inverter of a vehicle, the power module assembly comprising:
    a housing including a panel extending between opposing end caps and having an inner side defining a first connection feature extending along a longitudinal direction of the panel, wherein the housing further includes a cavity at least partially defined by the inner side and the end caps, and at least one of the end caps defines a coolant port; and
    an array of cards disposed within the cavity and each having opposing major sides and minor sides extending therebetween, wherein at least one of the cards defines a second connection feature extending across one of the major sides of the card and engaging with the first connection feature to connect the card and the panel, and wherein a coolant passage that is in fluid communication with the port is defined between the at least one card and the panel, and is configured to convey coolant directly across the at least one card.

2. The power module assembly of claim 1 wherein the first connection feature is a groove, and the second connection feature is a projection that is disposed within the groove.

3. The power module assembly of claim 1 wherein the first connection feature is a projection, and the second connection feature is a groove that receives the projection.

4. The power module assembly of claim 1 wherein the at least one card further defines a third connection feature extending across the other of the major sides, further comprising a center spacer extending between the end caps and defining a fourth connection feature that engages with the third connection feature to connect the card and the center spacer.

5. The power module of claim 4 wherein the third connection feature is a projection, and the fourth connection feature is a groove that receives the projection.

6. The power module of claim 1 wherein the other of the end caps defines a second coolant port.

7. A power module assembly comprising:
opposing end caps collectively having coolant ports;
a row of cards that each have a major side defining a projection extending across the card; and
a side panel extending between the end caps such that the panel and the row define a channel in fluid communication with the ports and configured to convey coolant directly across the cards, wherein the side panel defines a groove that receives the projections.

8. The power module assembly of claim 7 wherein each of the cards further includes a second major side defining a second projection extending across the card, and further comprising a second side panel extending between the end caps and defining a groove that receives the second projections.

9. The power module assembly of claim 8 wherein the second panel and the row define a second channel in fluid communication with the ports.

10. The power module assembly of claim 7 wherein each of the cards further includes a second major side defining a second projection extending across the card, and further comprising a center spacer extending between the end caps and having a first side defining a groove that receives the second projections.

11. The power module assembly of claim 10 further comprising:
a second side panel extending between the end caps and defining a groove; and
a second row of cards that each have a first major side defining a third projection extending across the card and disposed within a groove defined in a second side of the center spacer, and a second major side having a fourth projection extending across the card and disposed within the groove of the second side panel.

12. The power module of claim 7 wherein the coolant ports are an inlet port defined in one of the end caps and an outlet port defined in the other of the end caps.

13. The power module of claim 7 wherein the coolant ports are an inlet port and an outlet port both defined in one of the end caps.

14. A power module assembly comprising:
a card module including spaced apart side panels defining a coolant chamber and cards disposed therein; and
opposing end caps each including walls defining a cavity that receives one end of the card module such that an inner surface of the walls engages with an outer surface of the panels, one of the end caps defining a port in fluid communication with the chamber to convey coolant across the cards.

15. The power module of claim 14 wherein the inner surface of each of the end caps defines a first recess that receives a portion of one of the side panels, and a second recess that receives a portion of the other of the side panels.

16. The power module of claim 14 wherein at least some of the cards are arranged in a first row such that a major side of each of the cards in the first row faces one of the side panels, and wherein the one of the side panels has a ledge extending therefrom and engaging with the major side of each of the cards in the first row to define a coolant passage between the first row and the one of the side panels.

17. The power module of claim 16 wherein the ledge defines a groove extending longitudinally across the panel, and wherein the major side of each of the cards in the first row defines a projection received within the groove.

18. The power module of claim 14 wherein the cards are arranged in first and second substantially parallel rows, and wherein a center spacer is disposed between the first and second rows to create a coolant passage defined between the first and second rows and in fluid communication with the port.

19. The power module of claim 18 wherein the center spacer has a first side defining a groove that receives a portion of each of the cards of the first row, and has a second side opposite the first side that receives a portion of each of the cards of the second row.

20. The power module of claim 14 wherein the other of the end caps defines a second port in fluid communication with the chamber.

* * * * *